United States Patent [19]

Jones

[11] Patent Number: 6,108,938

[45] Date of Patent: Aug. 29, 2000

[54] METHODS AND APPARATUS FOR DRYING CONVEYORIZED ARTICLES OF MANUFACTURE

[76] Inventor: Jeff Jones, 1202 N. Kamkakee St., Lincoln, Ill. 62656

[21] Appl. No.: 09/240,201

[22] Filed: Jan. 29, 1999

Related U.S. Application Data

[63] Continuation-in-part of application No. 09/231,740, Jan. 15, 1999, abandoned.

[51] Int. Cl.$^7$ ........................................................ F26B 3/00
[52] U.S. Cl. ................................. 34/487; 34/236; 34/241; 34/232; 198/493
[58] Field of Search ............................... 34/487, 225, 241, 34/232, 233, 236; 198/470.1, 473.1, 476.1, 478.1, 487.1, 493, 778

[56] References Cited

U.S. PATENT DOCUMENTS 4,777,734  10/1988  Elferink ..................................... 34/236

*Primary Examiner*—Denise L. Ferensic
*Assistant Examiner*—Michelle Mattera
*Attorney, Agent, or Firm*—David G. Henry

[57] ABSTRACT

The invention is of methodologies and associated equipment, the practice and use of which, in the context of drying systems used in the drying of conveyorized articles bearing residual moisture from prior manufacturing steps, provides substantially enhanced drying efficacy and substantially accelerated drying rates, when compared with presently available drying systems. The present invention is of certain design parameters for drying systems, and associated methods, the practice of which result in impingement pressures, created by air or flowing from drying system nozzles onto to-be-dried articles of manufacture, which fall between the certain optimum ranges discovered by the present inventor for drying articles such as printed circuit boards in an assembly line context. The design parameters pertain to relative dimensions and positioning of air supply conduits, manifolds, nozzles, and conveyor surfaces, as well as performance parameters such as the velocity of air exiting the drying system nozzles.

2 Claims, 3 Drawing Sheets

METHODS AND APPARATUS FOR DRYING CONVEYORIZED ARTICLES OF MANUFACTURE

This is a Continuation-in-part of application Ser. No. 09/231,740 filed Jan. 15, 1999, now abandoned.

BACKGROUND INFORMATION

A. Field of the Invention

This invention pertains generally to the field of apparatuses and methods useful in assembly line contexts in which articles, wet from a prior assembly or manufacturing steps, are to be dried. Embodiments of the present invention are particularly pertinent to the drying of such assembly line-manufactured or assembled articles which, because of irregular surfaces or complex assemblages of components (such as on printed circuit boards), tend to trap moisture and severely hinder forced air drying by means of any assemblage of drying equipment, and/or requires considerable space-consuming assembly line drying equipment and attendant expense to achieve acceptable levels and rates of component drying.

B. State-of-the-art

The assembly line production of certain products (printed circuit boards being of most relevance to the present invention) involves one or more stages in which the assembled product becomes wet and must thereafter be completely and thoroughly dried. In the context of printed circuit board manufacturing, thorough rinsing of printed circuit boards is required after the solder re-flow stage of production, after which certain metallic particles and residues must be flushed from the printed circuit boards to insure proper operation of the boards. However, after a printed circuit board is rinsed, it must be thoroughly dried for reasons apparent even to those least familiar with electrical components and systems.

Effective drying of printed circuit boards after the rinse stage is a challenge, even without time constraints. Certainly one could, in theory, simply heat a printed circuit board to a level that water is relatively quickly evaporated from circuit board surfaces and components, but excess heat is notoriously injurious to electronic components. In fact, heat dissipation in fully assembled electronic systems is a critical design consideration. Therefore, merely "baking away" moisture is not a preferred, or even practical approach to drying printed circuit boards.

The only categorical alternative to heat-based drying involves the use of forced air. Relying on forced air drying has significant drawbacks, however. The many "nooks and crannies" of printed circuit boards serve as havens for moisture deposits. Effective drying of printed circuit board assemblies requires moving water from such nooks and crannies, and impelling such removed water off of the circuit board, or spreading the moisture over comparatively larger surface areas to promote rapid evaporation. Effectively dislodging the moisture deposits from printed circuit boards is, however, the most significant challenge in effectively and quickly drying printed circuit boards.

The present state of the art dictates that the printed circuit board assembly industry's approach to the need for greater and greater component drying speed (to prevent backlogs of ever accelerating assembly lines) is to add redundant drying equipment to the assembly line. This is not a desirable solution. Assembly line space, particularly in the high tech arena, is a premium resource. Anything which increases the overall length of an assembly line increases overhead costs. Compounding the problem is the added cost associated with the additional drying equipment (whether in the form of additional, independently operating units, or enlarged unitary systems).

One type of approach currently used in the art of conveyorized drying of printed circuit boards (and other assemblies presenting similar drying challenges) involves delivering one or more air streams from one or more delivery manifolds, each of which is commonly termed an "air knife." Each air knife is mounted in relative close proximity to one or both sides of the assembly line conveyor at appropriate locations along the linear progression of the assembly line where drying is appropriate. The air knife manifolds are typically oriented laterally with respect to the direction of conveyance. The air stream(s) from the manifold(s) are emitted via either relatively narrow slot(s), or a series of relatively small holes, and travel in a direction which is relatively normal to the imaginary conveyance plane approximated by the space traveled by the manufactured articles.

When air emanates from air knives from one or more slots, the air supplied to the air knife manifold is typically turbine-driven. When forced air exits an air knife through small holes (rather than slots), air compressors are typically used to deliver air to the air knife manifolds. In either case, the air knife manifolds are positioned at a sufficient distance from the assembly line conveyor to avoid physical obstruction of other manufacturing equipment or processes.

The present inventor has determined through exhaustive research and experimentation that the physical distance between an air knife manifold and a to-be-dried article drastically affects the efficacy of a drying system. This effect is most pronounced with respect to removing liquid deposits from relatively small spaces and/or irregular spaces on or in the assemblies. Nevertheless, in an assembly line context, this distance can be diminished only to a certain degree because of the overall dimensions of the to-be-dried article as it passes under an air knife, and the irregularity of the surface(s) of the to-be-dried-article.

In an attempt to increase drying efficiency and speed, some drying system designers orient air knife manifolds whereby the emanating air streams impinge the to-be-dried articles at other than normal angular orientations relative to the imaginary conveyance plane of the assembly line. Also, seeking the same objective, additional manifolds are added to enhance drying of assemblies. It has been found, however, that such angling of air knife manifolds and/or adding manifolds, although providing incremental improvement in over-all drying efficacy by the end of the assembly line, provides even less than incremental improvement in such efficacy when measured on and added unit by added unit basis. When analyzing the situation from the perspective of a single drying system, re-orientation of air streams is relatively inadequate in substantially improving the removal of entrapped liquid from printed circuit board assemblies.

In summary, neither increasing the volume of drying air in an air drying system, nor impinging a to-be-dried printed circuit board (or other to-be-dried assembly) with air streams of varying relative orientations materially advance the cause of more effectively and quickly drying printed circuit boards and the like.

Another approach found in the art is that of rotating air knife manifolds about an axis which is substantially perpendicular to the imaginary plane of the assembly line conveyor. This approach, which may be combined with one or more of the schemes described above, can be advantageous in reaching relatively open areas between components mounted on the same article, one or the other (or both) of which may obstruct impingement of air upon the relative open area from certain directions. However, such rotation does relatively little to increase the physical removal of entrapped rinsing liquid, and still requires relatively undesirably long drying times.

Another common approach in the existing art is the pre-heating of the drying air in any of the above-described configurations. Although such pre-heating accelerates the evaporation of residual thin films of surface rinsing liquid on assemblies which are to-be-dried, the relative inefficiency of transferring the beat from said air to the entrapped water in the relatively small confined spaces prevents such pre-heating from substantially improving the overall rate of drying assemblies as desired. Furthermore, as referenced above, there are definite limits to the degree to which drying air temperature may be increased without risking damage to electronic components. Further still, there are obvious energy consumption issues surrounding such an approach as this.

Also in the current art, one or more flat plates which extend adjacent tangentially away from the sides of the air knife slots, or through which a series of holes penetrate in the air knife manifolds, are used to confine the lateral and longitudinal air flow between the plates and the articles to-be-dried. For generally flat articles, and assuming a relatively close proximity between the air knives and the to-be-dried articles, this drying systems approach helps to maintain a relatively high velocity of air (or other drying gas) across the surface of the articles. This high air velocity is also generally tangential to the surface of the articles to-be-dried, and substantially increases both the physical removal of, and the rate of evaporation of the rinsing liquid. However, for the conveyorized drying of articles with complex or irregular topographies, or to which are attached components with substantial thickness, this approach to increasing drying effectiveness is largely offset by the requirements of space between the air knife orifices and the to-be-dried articles, which is required to prevent entanglement between the drying equipment and the conveyorized articles. The resulting gap between the air knife orifices substantially reduces the effectiveness of the plates in the entraining the air flow and improving drying efficiency. Furthermore, the irregularity of components attached to a to-be-dried article (components on a printed circuit board, for example) severely restrict the tangentiality of the air or gas flow which might otherwise be is applied to the typically confined areas where residual rinsing fluid is entrapped, and are therefore less than desirably efficient from an energy usage standpoint.

In view of the above, there exists in the manufacturing industry, the electronics assembly industry in particular, a dramatic need for improved methods and associated equipment which would be useful in the drying a conveyorized articles. Improvements are needed both with respect to overall drying efficacy and with respect to speed at which such articles can be dried in assembly line contexts.

SUMMARY OF THE INVENTION

It is an object of the present invention to provide an improved methodology and associated equipment through the use of which conveyorized articles of manufacture which require drying can be more effectively dried.

It is another object of the present invention to provide an improved methodology and associated equipment for drying conveyorized articles of manufacture, the practice or use of which improves drying efficacy while reducing, or at least not increasing, the amount of space required for drying equipment in an assembly line context.

It is another object of the present invention to provide an improved methodology and associated equipment for drying conveyorized articles of manufacture, the practice or use of which accelerates the rate at which articles are dried, without requiring the consumption of additional assembly line space, or the installation of redundant drying systems.

It is another object of the present invention to provide methodologies and associated equipment, the practice and use of which obviates the need for additional or redundant drying system equipment in order to achieve greater drying efficacy and/or a more rapid pace of drying in the context of conveyorized articles of manufacture which must be ridded of residual moisture from some prior of manufacturing step.

In satisfaction of these and related objects, the present invention provides methodologies and associated equipment, the practice and use of which, in the context of drying systems used in the drying of conveyorized articles bearing residual moisture from prior manufacturing steps, provides substantially enhanced drying efficacy and substantially accelerated drying rates, when compared with presently available drying systems.

The present invention is based on the inventor's discovery that the greatest optimization of drying efficacy and rate in the context of assembly line drying systems for conveyorized articles of manufacture is achieved, not through drying system redundancy, increasing the air flow rate, angling of air orifices, movement of air knife equipment relative to manufactured articles, or any of a number of other approaches presently applied in the industry, but primarily through the achievement of certain impingement pressures as air streams encounter the varying surfaces of a to-be-dried article.

In connection with the present invention, the present inventor has developed certain parameters pertaining to air delivery system pressure, dimensions of drying system conduits, dimensions and cumulative cross-sectional area of nozzles, ratios involving the aforesaid parameters and the distance between drying system nozzles and to-be-dried articles, and other parameters which will be disclosed below.

In the experiments involving drying systems assembled according to be herein disclosed invention and specification, and for comparison with presently available industrial drying systems, the inventor was able to achieve considerably accelerated drying times and substantially more complete drying of articles which, for comparison purposes, had been dried with presently available drying systems. These benefits were achieved through the use of equipment which occupied less floor space than, in some cases, a single drying system of the present art (even though multiple such systems would be required to approach the speed and efficacy of inventor's system).

DETAILED DESCRIPTION OF THE PREFERRED EMBODIMENT

Figure 1:
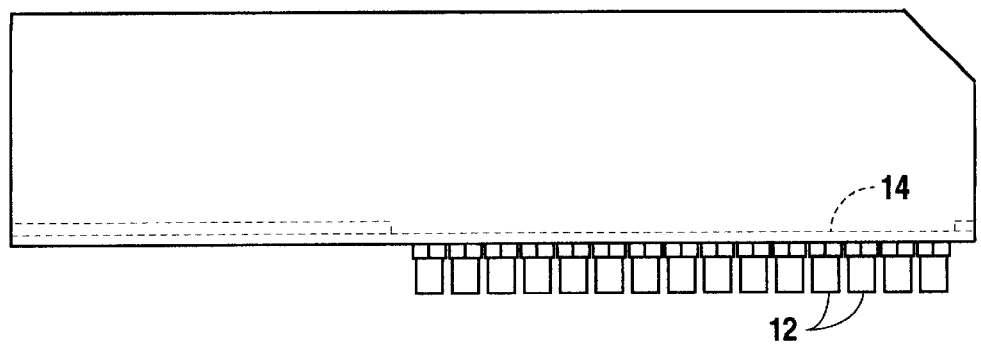
FIG. 1 depicts a front elevational view of an upper manifold of a preferred embodiment of the present invention when viewed in parallel with the direction of a to-be-dried article on an assembly line with which the present system would likely be used.

The efficacy of the present invention depends upon an even distribution of drying air or (or other drying gas) over the entirety of a to-be-dried article, and most particularly upon the achieving of certain levels of impingement pressure as the drying air or impacts the to-be-dried surfaces. The parameters described in this specification, as relate, at least in part, to air supply conduit diameters, the arrangement and collective orifice cross sectional area of drying system nozzles, and ratios of distances between air knife orifices and to-be-dried articles vis-a-vis air flow from drying system nozzles, when incorporated (either literally, or through differing parameters, the internal relationships of which are, nevertheless, maintained) into an industrial drying system, prescribe an industrial drying system of substantial advancement over presently available alternatives.

It should be understood that the depictions provided in the accompanying figures are only schematic in nature, and do not purport to depict fully detailed drying systems inclusive of hardware and equipment arrangements which are well known to those skilled in the art, and are not of pertinent to the present invention, nor to the distinction between the present invention and the prior art.

All embodiments of the present invention are designed to achieve a certain minimum impingement pressure which results from the drying air (propelled from drying manifold nozzles) impacting surfaces of to-be-dried articles in a conveyorized manufacturing context, as well as achieving at least such minimum impingement pressure on as many surfaces of a to-be-dried article, regardless of their orientation, as is possible.

Exhaustive experimentation has shown that an impingement pressure of drying air of an air knife drying system of at least 0.5 psi is not a sought-after feature of existing drying systems, nor is reaching this level of impingement pressure recognized in the field as significant. Yet, the present inventor has determined that effecting an impingement pressure of at least 0.5 psi on any given surface of an irregular article of manufacture significantly increases the overall drying efficacy of drying systems in the context of conveyorized articles of manufacture (printed circuit boards being the most relevant example). In addition to maximizing basic efficacy of drying systems (minimizing the amount of moisture remaining at the end of the drying process) attaining this threshold level of impingement pressure significantly increases the rate at which drying takes place (a factor which favorably suits the faster assembly lines of today).

For most printed circuit board applications, the present inventor has determined that impingement pressures greater than approximately 0.5 psig for conveyor speeds of about 2 feet per minute or more, greater than approximately 0.8 psig for conveyor speeds of about 3 feet per minute or more, and greater than approximately 1.0 psig for conveyor speeds of about 4 feet per minute or more provided efficacy and drying speed far in excess of anything seen in the art before. Still further, achieving such impingement pressures, far more than any of the prior art approaches described in the Background Of the Invention section hereof, reduces the need for redundant equipment, the consumption of floor space, and the energy requirements (when compared to approaches involving heated drying air).

It was further determined that the maximum impingement pressure required depends not only on the desired conveyor speed, but also on the complexity of the to-be-dried surface. For example, for relatively slower conveyor speeds (e.g., less than approximately 2–3 feet per minute), and for products of relatively low complexity, the maximum desired impingement pressure is about 2.2 psig. Exceeding this value is not seen as in any way damaging to the product, but merely wasteful in terms of energy usage. For medium conveyor speeds (e.g., in the range of approximately 2–5 feet per minute) and/or medium complexity to-be-dried surfaces, the maximum preferred impingement pressure is about 3.0 psig. Finally for high conveyor speeds (e.g., above approximately 4 feet per minute) and/or high complexity to-be-dried surfaces, the maximum preferred impingement pressure is about 4.0 psig.

Achieving the impingement pressures described above is a function of assembling conduits, nozzles, and air supply apparatus of particular relative dimensions and capacities, and arranging these components in certain particular relative manners. The embodiments of the present invention described in this specification achieve the desired impingement pressures. Such conduits and nozzles, and any associated manifolds, are preferably made from, or coated with, an electrically conductive material in order to minimize the build-up of static charges in the drying equipment or in the drying air.

Figure 2:
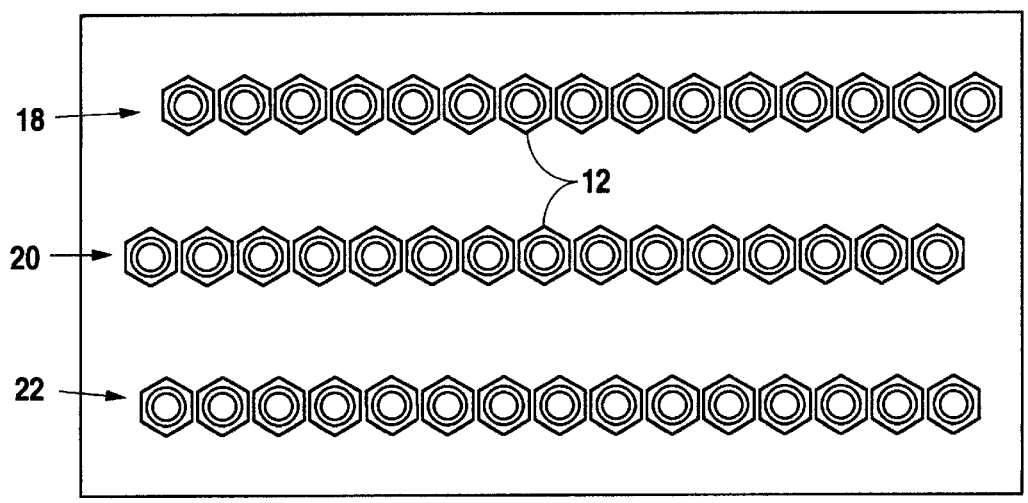
FIG. 2 depicts a side view of an upper manifold of the embodiment of FIG. 1.
Figure 3:
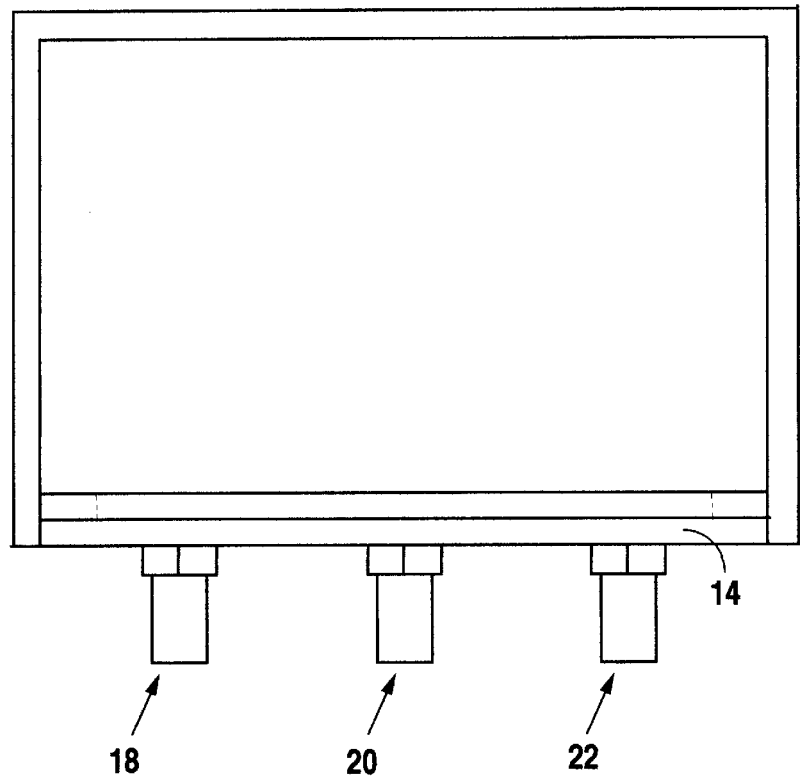
FIG. 3 depicts a side view of an upper manifold of the embodiment of FIGS. 1 and 2.
Figure 4:
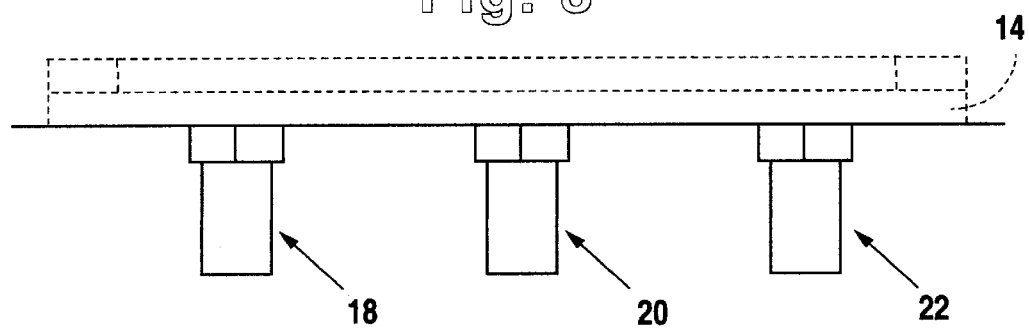
FIG. 4 depicts a side view of both an upper and lower of manifold of the embodiment of FIGS. 1, 2, and 3.
Figure 4:
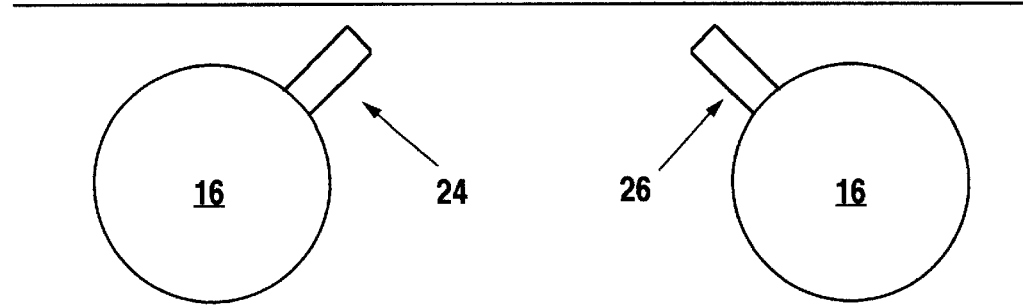

Referring principally to FIGS. 1 and 2, in a first embodiment of the present invention which is configured for particular application in the printed circuit board manufacture and assembly industry, five rows of nozzles 12 are provided, three rows emanating from an upper manifold 14, and two rows emanating from a lower manifold 16. Each row of upper manifold 14 has twenty two nozzles 12 spaced within the row on approximately 1" centers, and each row of the lower manifold 16 has 36 nozzles spaced within the row on approximately ⅝" centers.

As depicted in FIG. 2, each row of nozzles 12 is offset transversely relative to the other rows by 0.3". Nozzles in the first row 18 have interior diameters ("ID") of approximately 0.36". The nozzles 12 of the second row 20, and of the third row 22, all exhibit ID of approximately 0.6".

For the application of drying assembled printed circuit boards, the preferred ID of nozzles 12 of the present invention ranges from about 0.250" to about 2.5". An ID less than this range produces drying air jets which tend to dissipate and lose much of their momentum within an undesirably short distance from the nozzle, and an ID greater than this tends to require an undesirably large flow rate of air to obtain the desired impingement pressures. For the purpose of this invention, the ID of a non-circular nozzle would be the narrowest average inside width, which average inside width would be defined as the average inside-edge-to-inside-edge distance parallel to a given line, which given line is perpendicular to the axis of the nozzle. Also, in order for the jets issuing from nozzles 12 to retain sufficient momentum to impart the desired impingement pressure, it has been found by the inventor that for best efficiency, the ratio of the ID of the nozzle to the distance from the nozzle to the to-be-dried article should be preferably in the range of about 0.1 to about 0.8, and more preferably in the range of about 0.2 to about 0.5.

A fourth row 24 of nozzles 12 emanating from a lower manifold 16 are preferably positioned, relative to upper manifold 14, such that row 24 of nozzles 12 extends along a first imaginary line which, if upper manifold 14 and lower manifold 16 were superimposed, such first line would extend in parallel with and between the first row 18 and second row 20 of upper manifold 14. Each of the nozzles 12 of the fourth row 24 exhibit ID of about 0.36". A fifth row 26 of nozzles 12 in lower manifold 16 extends along a second imaginary line which, if the manifolds were superimposed as just described, the second such line would extend in parallel with and lie between the second row 20 and third row 22. This preferred relative positioning of rows 24 and 26 with respect to rows 18, 20 and 22 helps to insure that the collective downward force imparted by drying air issuing from nozzles 12 of upper manifold 14 onto a to-be-dried article, is at all times greater than the collective upward force imparted by drying air issuing from nozzles 12 of lower manifold 16 onto the to-be-dried article. The length of the to-be-dried articles in the direction of conveyor travel is preferably at least as great as the distance in the direction of conveyor travel between rows 18 and 20 or rows 20 and 22, so that at any time when air is impinging upon one or more of the lower surfaces of the to-be-dried article from at least one of the nozzles 12 in lower manifold 16, drying air is also simultaneously impinging upon at least one or more of the upper surfaces of the to-be-dried article from at least one of the nozzles 12 in upper manifold 14. This stated preferred relative positioning, in combination with the stated preferred relative length of the to-be-dried article, helps to avoid the need for auxiliary hold-down devices or auxiliary hold-down conveyor belts, which are seen as disadvantageous. The ID of nozzles 12 of the fifth row are also about 0.36". Nozzles 12 of the fifth row 26 are offset transversely relative to the nozzles 12 of the fourth row 24 by about 5/16".

The offsetting of nozzles 12 in adjacent rows of nozzles 12, for both the top and bottom manifolds 14 and 16, is important to achieve uniform coverage of drying air over a to-be-dried article. Experimentation has demonstrated that the simple omission of staggered nozzles, such as described above, somewhat adversely impacts the drying efficacy and rate of drying of a drying system otherwise made generally according to the present disclosure.

For the applications involving printed circuit board assembly lines, nozzles 12 need to be able to clear the components mounted on the printed circuit board as the board moves along the assembly line conveyor. Nozzles 12, therefore, usually must be spaced at least one inch from the conveyor surface on which the printed circuit boards are carried. Increasing distance between nozzles 12 of a drying system and to-be-dried articles, decreases impingement pressure for any given nozzles air velocity and manifold pressure. Certain thicker and/or larger components on printed circuit boards require an increase in such spacing. Nevertheless, recognizing the central lesson of the present invention—that impingement pressures are the key to effective and rapid drying of conveyorized articles—practitioners of the present invention will know to make certain adjustments of drying system parameters according to the present invention to achieve the desired impingement pressures and resulting drying efficacy and speed. In fact, armed with the knowledge taught herein, practitioners of the present invention can make the necessary adjustments to drying system design parameters which will allow greater spacing between nozzles and to-be-dried articles to obviate the need for adjustment as articles of differing thicknesses are processed along any given assembly line.

As mentioned in the Background of the Invention section, it is necessary that the nozzles 12 be spaced at least a distance from the conveyor to prevent entanglement between the drying apparatus and the articles to be dried. In general for circuit board assemblies, this distance should be at least about 1 inch, and, depending on the type of components affixed thereon, the distance could be set at 1.25 inches, 2 inches, or as great as 6 inches. The preferred embodiment of the present invention described herein is based on a spacing of approximately 3.5 inches between nozzles 12 of upper manifold 14 and the nearest surface of conveyor 50. Since most circuit board assemblies have components primarily attached to one side only (which for FIG. 1 and FIG. 2 would be the side facing upper manifold 14), the distance between nozzles 12 in lower manifold 16 need not be as great. If there are no components of significant size attached to the bottom side of the circuit board assemblies, the distance between nozzles 12 in lower manifold 16 and the lower side of conveyor 50 is preferably 0.125" to 2".

The pressure inside the manifold, nozzle internal diameter, average velocity of air just as it leaves the nozzle, and distance between the nozzle and to-be-dried surface all play a role in the impingement pressure obtained. For the preferred embodiment, it has been found that to obtain the impingement pressures between –0.5 psig and 4.0 psig, a nozzle air velocity of from about 255 feet/second to about 560 feet/second are required. Table 1 gives examples of impingement pressure given by various configurations. The distance between nozzle and the to-be-dried surface is 3.5" in each case, to represent the worst case of the preferred embodiment, and the air temperature is approximately 110–120 degrees Fahrenheit.

TABLE 1

Approximate impingement pressure and nozzle velocities obtained with various configurations and distance between nozzle and to-be-dried article at 3.5 inches.

| Nozzle ID Inches | Manifold Pressure, psig | Nozzle air velocity, feet/second | Impingement Pressure, psig |
| --- | --- | --- | --- |
| 0.365 | 1.75 | 330 | 0.5 |
| 0.365 | 2.8 | 405 | 0.8 |
| 0.365 | 3.5 | 445 | 1.0 |
| 0.615 | 1.0 | 255 | 0.5 |
| 0.615 | 1.6 | 310 | 0.8 |
| 0.615 | 2.0 | 340 | 1.0 |
| 0.615 | 4.4 | 480 | 2.2 |
| 0.615 | 6.0 | 545 | 3.0 |
| 0.800 | 0.8 | 230 | 0.5 |
| 0.800 | 1.3 | 280 | 0.8 |
| 0.800 | 1.6 | 310 | 1.0 |
| 0.800 | 3.6 | 435 | 2.2 |
| 0.800 | 4.9 | 495 | 3.0 |
| 0.800 | 6.6 | 560 | 4.0 |

To best achieve the nozzle velocities as just described, the present invention prescribes certain ratios between the cross-sectional area of air supply conduits which feed any given manifold in the air drying system and the cumulative cross-sectional area of all nozzles in that manifold. This ratio, at a minimum, would be 2:1, but is preferably in the range of 10:1. In any event, the cross-sectional area of an air supply conduit for a manifold in an air drying system of the present invention will significantly exceed the cumulative cross-sectional area of the associated nozzles.

Another parameter which bears on the overall efficacy of a drying system made according to the present invention relates to be relative spacing of nozzles 12. If nozzles 12 are spaced too sparsely, "dead spots" will exist at the surface of the to-be-dried article, and overall efficacy will be diminished, even if the desired impingement pressures are achieved elsewhere on the article. It is recommended, therefore, that nozzles 12 are spaced at a distance of between 1 and 8 times their inside diameter. For the embodiments mentioned, the nozzles are spaced in their corresponding rows at a distance of between 1.7 and 3.1 times their inside diameter. The preferred range for nozzle spacing within rows is approximately 1.5 to 4 times the nozzle inside diameter. In the alternative, more nozzle rows than described herein can be used to effectively duplicate the intra-row spacing just described.

Yet another parameter discovered to be important in achieving the desired impingement pressures relates to the length of nozzles 12. It is recommended that nozzles 12 be no less than 0.25", nor more than 3" in length. Insufficient length for nozzles 12 will result in an ill defined air jet. Excessive length creates undesirable pressure loss, and negatively impacts impingement pressure at the level of the to-be-dried article.

Figure 5:
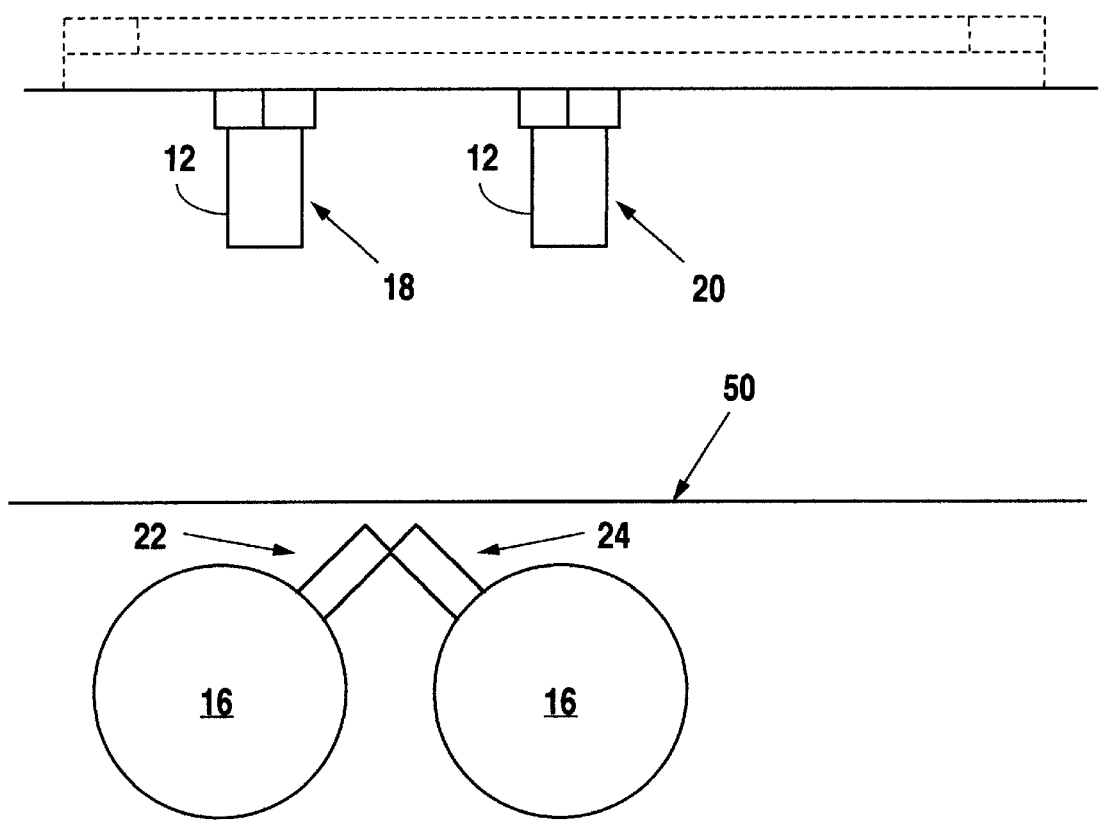
FIG. 5 depicts a frontal view of upper and manifolds of an alternative embodiment of the present invention.

Referring principally to FIG. 5, a second embodiment of the present invention prescribes four rows of nozzles 12. Each of the two upper rows 18 and 20 have fifteen nozzles 12 of ID 0.800" spaced on 1.5" centers. The second row 20 is offset transversely from the first 18 row by 0.75" in the same sense as the first embodiment.

A third row 22 and fourth row 24 of nozzles 12 extend from lower manifold 16, and exhibit of the same ID, center-to-center spacing, and lateral offset as described above with reference to be fourth row 24 and fifth row 26 of the first embodiment.

The nozzles 12 of third row 22 and fourth row 24 are aligned, respectively, along third and fourth lines which, if upper manifold 14 and lower manifold 16 were superimposed, would extend parallel with, but between, the imaginary lines along which the nozzles 12 of first row 18 and second row 20 extend from upper manifold 14.

To measure the impingement pressure which is mentioned throughout this disclosure, one may use a device which includes at least a small ("sampling hole") in communication with which is installed a pressure gauge (e.g., reading 0–50 inches of water, or some other appropriate pressure range—Magnahelic brand, Dwyer Instruments, Inc., Michigan City, Ind., for example). An approximately ½"×5"×9" piece of plastic, such as polypropylene, provides an ideal such plate. A small hole, e.g. 0.020" in diameter is formed centrally through the plate extending from one broad face to the other. For present purposes, impingement pressure is measured by placing the plate at a distance from a nozzle or nozzle assemblage which is of analytical interest, and, with the plate positioned such that the small hole is within the area of approximate greatest impingement pressure under action of the nozzle(s) of interest, orienting the plate such that the air flow from the nozzle(s) is substantially normal to the plate's face.

Although the invention has been described with reference to specific embodiments, this description is not meant to be construed in a limited sense. Various modifications of the disclosed embodiments, as well as alternative embodiments of the inventions will become apparent to persons skilled in the art upon the reference to the description of the invention. It is, therefore, contemplated that the appended claims will cover such modifications that fall within the scope of the invention.

I claim:

1. An drying system for use in conveyorized assembly lines which drying system includes air propulsion means, a plurality of orifices in a manifold, from which orifices, air, supplied by the air propulsion means to the manifold by way of a conduit is emitted to impinge to-be-dried articles of manufacture, wherein the improvement comprises the following characteristics:

said orifices are positioned for lying within such a distance from said to-be-dried articles, said air propulsion means delivers such a volume of air to said conduit, said conduit is of such dimensions to carry such a volume of air, and such orifices defined such a cumulative cross-sectional area of openings into said manifold that air imaging said to-be-dried articles of manufacture creates an impingement pressure at the surface of said to-be-dried articles of not less than approximately 0.5 psig.

2. A method for drying conveyorized articles of manufacture comprising the steps of:

selecting a drying system which includes such air propulsion means, such conduit means in communication with said air or propulsion means, such manifold means connected to said conduit means, such assembly of nozzles from which air, flowing from said manifold through said the nozzles, flows to impinge said conveyorized articles of manufacture, and such article of manufacturer support and conveyor means for positioning said conveyorized articles of manufacture for said air to impinge thereon, that, when actuated, said air flowing from said nozzles impinges said articles of manufacture and creates an impingement pressure of not less than approximately 0.5 psig;

positioning said articles of manufacture on said article of manufacture support and conveyor means; and actuating said drying system to dry said articles of manufacture.

\* \* \* \* \*